(12) United States Patent
Kushida

(10) Patent No.: US 12,665,038 B2
(45) Date of Patent: Jun. 23, 2026

(54) CLOCK SIGNAL GENERATOR AND METHOD OF OPERATING THE SAME

(71) Applicant: Samsung Electronics Co., Ltd., Suwon-si (KR)

(72) Inventor: Keiichi Kushida, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 243 days.

(21) Appl. No.: 18/541,839

(22) Filed: Dec. 15, 2023

(65) Prior Publication Data

US 2024/0249781 A1 Jul. 25, 2024

(30) Foreign Application Priority Data

Jan. 25, 2023 (KR) ........................ 10-2023-0009543

(51) Int. Cl.
*G11C 8/00* (2006.01)
*G11C 16/30* (2006.01)
*G11C 16/32* (2006.01)

(52) U.S. Cl.
CPC .............. *G11C 16/32* (2013.01); *G11C 16/30* (2013.01)

(58) Field of Classification Search
CPC ......... G11C 16/32; G11C 16/30; G11C 7/222; G11C 5/147; G05F 1/567
USPC ..................................................... 365/233.1
See application file for complete search history.

(56) References Cited

U.S. PATENT DOCUMENTS

| | | | |
|---|---|---|---|
| 6,366,175 B2 | 4/2002 | Oka | |
| 8,067,992 B2 | 11/2011 | Chen et al. | |
| 8,710,939 B2 | 4/2014 | Kim | |
| 9,438,205 B2 | 9/2016 | Kim et al. | |
| 9,685,238 B2 * | 6/2017 | Gangasani | .......... H03K 3/0231 |
| 10,461,700 B2 | 10/2019 | Liang et al. | |
| 10,951,163 B1 | 3/2021 | Lee et al. | |
| 11,228,302 B1 | 1/2022 | Heidary Shalmany et al. | |
| 11,437,981 B1 | 9/2022 | Liberti et al. | |
| 2022/0239284 A1 | 7/2022 | Yu et al. | |

FOREIGN PATENT DOCUMENTS

| | | |
|---|---|---|
| KR | 100416456 B1 | 1/2004 |
| KR | 101104720 B1 | 1/2012 |
| KR | 102074946 B1 | 2/2020 |
| KR | 10-2022-0106461 A | 7/2022 |

* cited by examiner

*Primary Examiner* — Tha-O H Bui
(74) *Attorney, Agent, or Firm* — Harness, Dickey & Pierce, P.L.C.

(57) ABSTRACT

A clock signal generator includes a power voltage providing circuit configured to provide a power voltage changing according to a temperature based on a temperature coefficient, a first reference voltage providing circuit configured to provide a first reference voltage based on an internal power voltage, and a clock signal generating circuit configured to generate a clock signal based on the power voltage and the first reference voltage.

18 Claims, 20 Drawing Sheets

10

TC<4:0> $\longrightarrow$ $\overline{\text{TC}}$<4:0>

FIG. 5

CLOCK SIGNAL GENERATOR AND METHOD OF OPERATING THE SAME

CROSS-REFERENCE TO RELATED APPLICATION

This application is based on and claims priority under 35 U.S.C. § 119 to Korean Patent Application No. 10-2023-0009543, filed on Jan. 25, 2023 in the Korean Intellectual Property office, the disclosure of which is incorporated by reference herein in its entirety.

BACKGROUND

The inventive concepts relate to a memory device, and more particularly, to a clock signal generator and a memory device including the clock signal generator.

Semiconductor memory devices may include a plurality of memory cells storing data. In addition, the semiconductor memory devices may be classified into volatile memory devices and non-volatile memory devices according to whether data stored therein is lost when power supply thereto is turned off. Operation characteristics of the memory cells may vary depending on a utilization environment such as temperature. The semiconductor memory devices may include a clock signal generator and may perform operations such as a program based on a clock signal. The cycles of the clock signals may vary depending on temperature.

SUMMARY

Provided is a clock signal generator, in which the cycle of a clock signal linearly changes according to temperature in an environment of large temperature change, and an operating method of the clock signal generator.

According to some example embodiments of the inventive concepts, the clock signal generator includes a power voltage providing circuit configured to provide a power voltage changing according to a temperature based on a temperature coefficient, a first reference voltage providing circuit configured to provide a first reference voltage based on an internal power voltage, and a clock signal generating circuit configured to generate a clock signal based on the power voltage and the first reference voltage.

In addition, according to some example embodiments of the inventive concepts, a clock signal generator includes a voltage control circuit configured to provide a voltage negative temperature coefficient VNTC, a voltage zero temperature coefficient VZTC, a second reference voltage provided by a bandgap reference circuit, and a power voltage changing according to a temperature based on a feedback voltage and a temperature coefficient, a first reference voltage providing circuit configured to provide a first reference voltage based on an internal power voltage corresponding to a constant voltage, and a clock signal generating circuit configured to generate a clock signal having a cycle proportional to the power voltage level based on the power voltage and the first reference voltage.

In addition, according to some example embodiments of the inventive concepts, a memory device includes a clock signal generator generating a clock signal and a memory cell array driving based on the clock signal. The clock signal generator includes a voltage control circuit configured to provide a voltage negative temperature coefficient VNTC, a voltage zero temperature coefficient VZTC, a second reference voltage provided by a bandgap reference circuit, and a power voltage changing according to temperature based on a feedback voltage and a temperature coefficient, a first reference voltage providing circuit configured to provide a first reference voltage based on an internal power voltage corresponding to a constant voltage, and a clock signal generating circuit configured to generate a clock signal having a cycle proportional to the power voltage level based on the power voltage and the first reference voltage. At least one of program operation, a read operation, or an erase operation on a memory cell array may be performed based on the clock signal.

BRIEF DESCRIPTION OF THE DRAWINGS

Some example embodiments will be more clearly understood from the following detailed description taken in conjunction with the accompanying drawings in which:

FIG. 5 illustrates a clock signal generating circuit according to some example embodiments;

DETAILED DESCRIPTION

Hereinafter, some example embodiments of the inventive concepts are described in detail with reference to the accompanying drawings.

Figure 1:
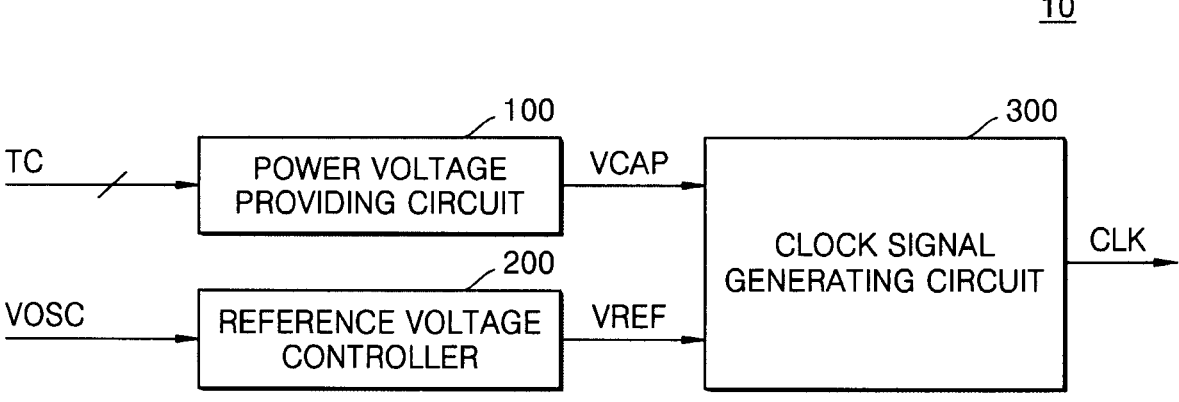
FIG. 1 illustrates a clock signal generator according to some example embodiments.

FIG. 1 illustrates a clock signal generator 10 according to some example embodiments.

An oscillator of relaxation type may be widely used in semiconductors. Recently, an oscillator having sufficient linearity to temperature has been required, or sufficient, even in environments having a wide range of temperature, that is, from high temperature to low temperature. For example, an integrated circuit included in an automobile exposed to a wide temperature range may include an oscillator having sufficient linearity to temperature. Hereinafter, a device and method of generating a clock signal having a cycle, which linearly changes as temperature changes, are presented.

Referring to FIG. 1, the clock signal generator 10 may include a power voltage providing circuit 100, a reference voltage controller 200, and/or a clock signal generating circuit 300.

The power voltage providing circuit 100 may generate a power voltage VCAP based on a temperature coefficient TC, and provide the generated power voltage VCAP to the clock signal generating circuit 300. The power voltage VCAP may be referred to as a power voltage VDD of the clock signal generating circuit 300. The power voltage providing circuit 100 may transfer the power voltage VCAP, which linearly changes according to temperature based on the temperature coefficient TC, to the clock signal generating circuit 300. The power voltage VCAP may affect charging time and/or discharging time of a capacitor included in the clock signal generating circuit 300.

The reference voltage controller 200 may generate a reference voltage VREF based on an internal power voltage VOSC of the clock signal generator 10, and provide the reference voltage VREF to the clock signal generating circuit 300. The reference voltage controller 200 may include one or more resistors and/or one or more N-channel metal-oxide semiconductor (MOS) NMOS transistors. In addition, the reference voltage controller 200 may include a circuit, in which source nodes and drain nodes of one or more NMOS transistors are connected to resistors in parallel. The reference voltage controller 200 may receive the internal power voltage VOSC of the clock signal generator 10, and output the reference voltage VREF via a circuit, in which source nodes and the drain nodes of one or more NMOS transistors are connected to resistors in parallel. The reference voltage controller 200 may output a reference voltage VREF that linearly changes according to temperature changes by using one or more resistors and one or more NMOS transistors. However, the reference voltage VREF provided by the reference voltage controller 200 may be insensitive to temperature changes, and may not be significantly affected by temperature changes. The reference voltage controller 200 may apply the reference voltage VREF to the clock signal generating circuit 300.

The clock signal generating circuit 300 may generate a clock signal based on the power voltage VCAP provided by the power voltage providing circuit 100 and/or the reference voltage VREF provided by the reference voltage controller 200. The clock signal generating circuit 300 may generate a clock cycle, which linearly changes according to temperature, based on the power voltage VCAP, which linearly changes according to temperature. In other words, the clock signal generated by the clock signal generating circuit 300 according to some example embodiments may linearly change according to temperature in a large temperature range. A cycle of the clock signal may be referred to as Tclk. The cycle of the clock signal Tclk may be represented by Formula 1 below.

$$Tclk = nRC\left(\frac{VCAP - VREF}{VOSC - VREF}\right) + \alpha(\text{propagation delay}) \qquad [\text{Formula 1}]$$

In Formula 1, Tclk may be referred to as the cycle of the clock signal generated by the clock signal generating circuit 300. n may be referred to as the number of NMOS transistors of the reference voltage controller 200. R may be referred to as a resistance value of resistors included in the reference voltage controller 200. C may be referred to as capacitance of capacitors included in the clock signal generating circuit 300. VCAP may be referred to as a power voltage of the clock signal generating circuit 300. VREF may be referred to as a reference voltage provided by the reference voltage controller 200. VOSC may be referred to as a voltage based on internal power supply. α may be referred to as a delay time based on a latch LATCH included in the clock signal generating circuit 300.

Referring to Formula 1, the cycle Tclk may be proportional to the power voltage VCAP. The power voltage VCAP may linearly change according to temperature change. For example, the power voltage VCAP may linearly increase as temperature increases. In some example embodiments, the power voltage VCAP may linearly decrease as temperature increases.

As described above, the reference voltage VREF provided by the reference voltage controller 200 may not be significantly affected by temperature, and the power voltage VCAP of the clock signal generating circuit 300 may have a linear relationship with temperature. Accordingly, the cycle Tclk of the clock signal generated by the clock signal generating circuit 300 may linearly change according to temperature change.

Figure 2:
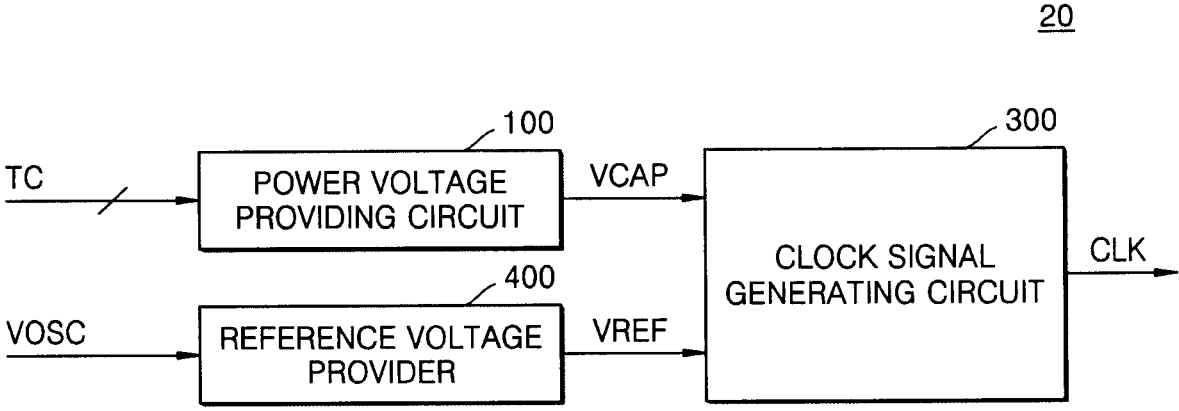
FIG. 2 illustrates a clock signal generator according to some example embodiments.

FIG. 2 illustrates a clock signal generator 20 according to some example embodiments. FIG. 2 may be described with reference to FIG. 1, and duplicate descriptions given with reference to FIG. 1 are omitted.

Referring to FIG. 2, the clock signal generator 20 may include the power voltage providing circuit 100, a reference voltage provider 400, and/or the clock signal generating circuit 300.

The power voltage providing circuit 100 may generate the power voltage VCAP based on the temperature coefficient TC, and provide the generated power voltage VCAP to the clock signal generating circuit 300. The power voltage VCAP may be referred to as the power voltage VDD of the clock signal generating circuit 300. The power voltage providing circuit 100 may transfer the power voltage VCAP, which linearly changes according to temperature based on the temperature coefficient TC, to the clock signal generating circuit 300.

The reference voltage provider 400 may generate the reference voltage VREF based on the internal power voltage VOSC, and provide the reference voltage VREF to the clock signal generating circuit 300. The reference voltage provider 400 may include one resistor and/or one or more NMOS transistors. The reference voltage provider 400 may receive the internal power voltage VOSC, and provide the reference voltage VREF to the clock signal generating circuit 300.

The clock signal generating circuit 300 may generate a clock signal based on the power voltage VCAP provided by the power voltage providing circuit 100 and/or the reference voltage VREF provided by the reference voltage provider 400. The clock signal generating circuit 300 may generate a clock cycle, which linearly changes according to temperature, based on the power voltage VCAP, which linearly changes according to temperature. In other words, the cycle of the clock signal generated by the clock signal generator 20 may linearly change according to temperature in a large temperature range.

However, the reference voltage VREF provided by the reference voltage controller 200 in FIG. 1 may be less affected by temperature changes than the reference voltage VREF provided by the reference voltage provider 400 in FIG. 2. Accordingly, the cycle of the clock signal generated by the clock signal generator 10 of FIG. 1 may maintain linearity better according to temperature changes than the cycle of the clock signal generated by the clock signal generator 20 of FIG. 2.

Figure 3A:
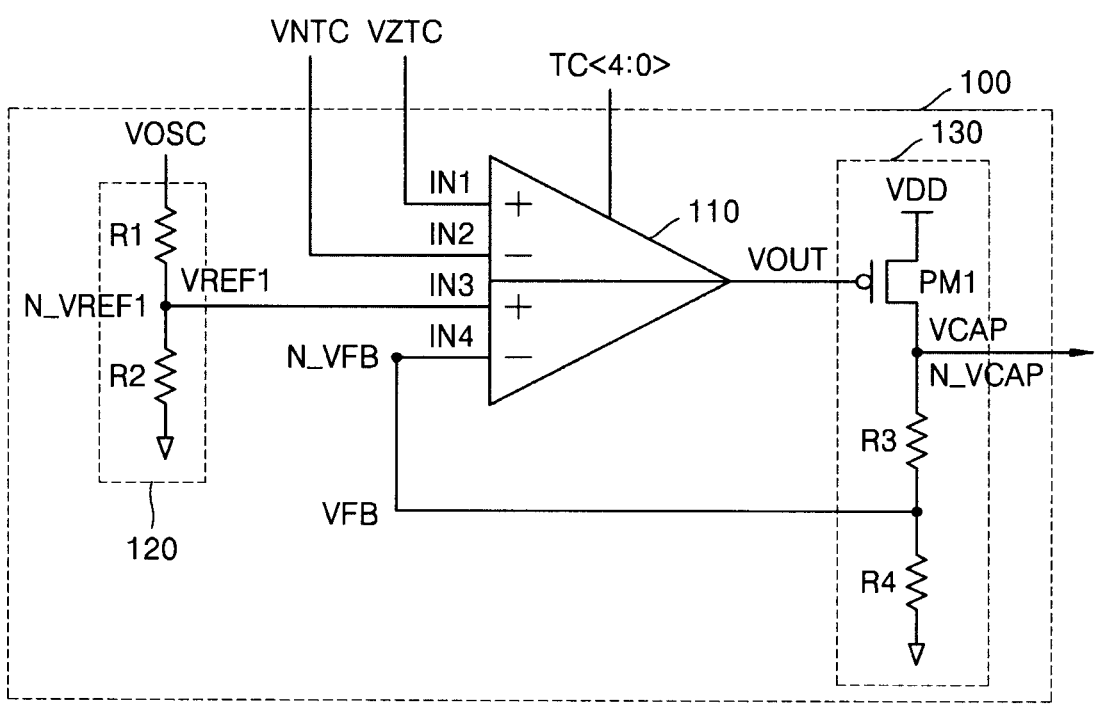
FIG. 3A illustrates a power voltage providing circuit according to some example embodiments.

FIG. 3A illustrates the power voltage providing circuit 100 according to some example embodiments. FIG. 3A is described with reference to FIGS. 1 and 2.

Referring to FIG. 3A, the power voltage providing circuit 100 may include a reference voltage providing circuit 120, a voltage control circuit 110, and/or a voltage output circuit 130.

The reference voltage providing circuit 120 may receive the internal power voltage VOSC of the clock signal generator 10 or the internal power voltage VOSC of the clock signal generator 20. The internal power voltage VOSC may be referred to as an internal power voltage IVS. The reference voltage providing circuit 120 may provide a reference voltage VREF1 based on the internal power voltage VOSC. As an example, the reference voltage providing circuit 120 may be the same as the reference voltage provider 400. Referring to FIG. 3A, the reference voltage providing circuit 120 may include resistors R1 and/or R2. A voltage level at a reference voltage node N_VREF1 may correspond to a level of the reference voltage VREF1. The reference voltage providing circuit 120 may apply the reference voltage VREF1 to a third input terminal IN3 of the voltage control circuit 110.

The voltage control circuit 110 may include first through fourth input terminals IN1 through IN4. The voltage control circuit 110 may receive the voltage negative temperature coefficient VNTC via the first input terminal IN1, and the voltage zero temperature coefficient VZTC via the second input terminal IN2. The voltage negative temperature coefficient VNTC and the voltage zero temperature coefficient VZTC are described in detail with reference to FIG. 3C. The voltage control circuit 110 may receive a temperature coefficient TC code. The temperature coefficient TC code may be represented by N bits. N may be a natural number. For example, the voltage control circuit 110 may receive a temperature coefficient TC code of 5 bits. The voltage control circuit 110 may receive a feedback voltage VFB via the fourth input terminal IN4. In other words, the voltage control circuit 110 may apply, to the voltage output circuit 130, an output voltage VOUT generated based on the voltage negative temperature coefficient VNTC, the voltage zero temperature coefficient VZTC, the reference voltage VREF1, the feedback voltage VFB, and/or the temperature coefficient TC code. The number of bits of the temperature coefficients TC code may vary and is not limited to the example of 5 bits described above.

The voltage output circuit 130 may include a P-channel MOS (PMOS) transistor PM1, a resistor R3, and/or a resistor R4. The resistor R3 may be connected between a power voltage node V_VCAP and a feedback voltage node N_VFB. The resistor R4 may be connected between the feedback voltage node N_VFB and a ground node. The output voltage VOUT of the voltage control circuit 110 may be applied to a gate of the PMOS transistor PM1. The voltage output circuit 130 may output the power voltage VCAP of the clock signal generating circuit 300.

Figure 3B:
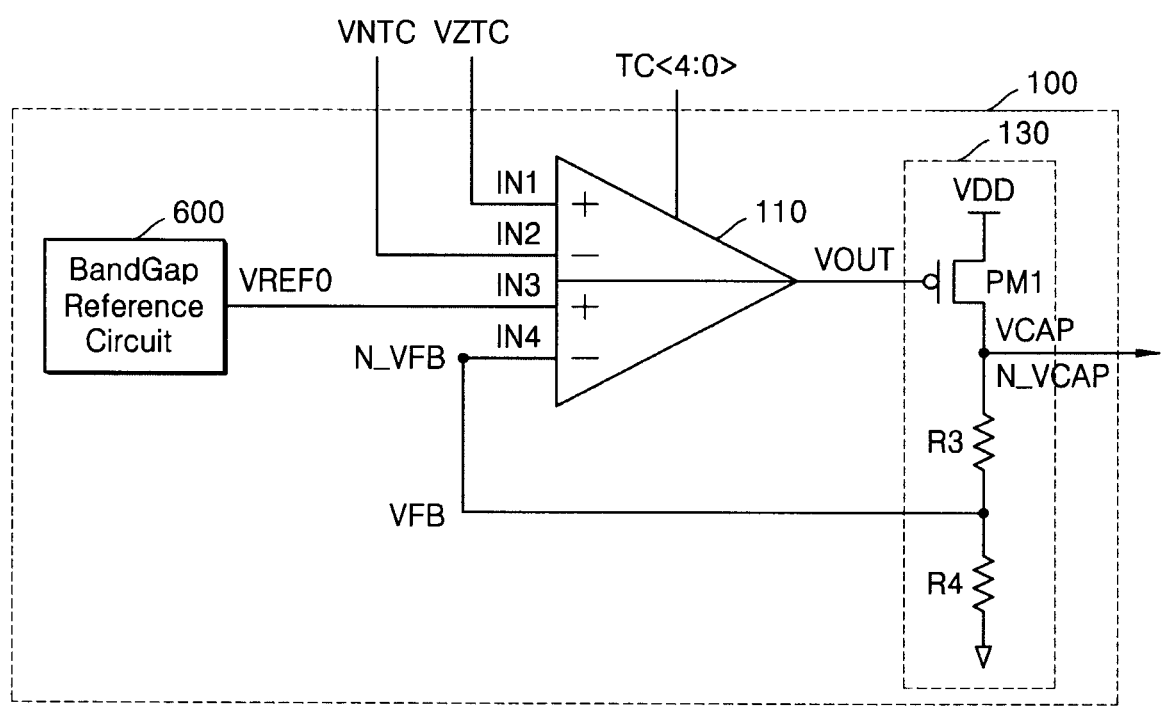
FIG. 3B illustrates a power voltage providing circuit according to some example embodiments.

FIG. 3B illustrates the power voltage providing circuit 100 according to some example embodiments. FIG. 3B may be described with reference to FIGS. 1, 2, and 3A. Duplicate descriptions given with respect to FIG. 3A may be omitted.

Referring to FIG. 3B, the power voltage providing circuit 100 may include the voltage control circuit 110 the voltage output circuit 130 and/or a bandgap reference circuit 600.

The bandgap reference circuit 600 may provide a reference voltage VREF0 to the voltage control circuit 110. The reference voltage VREF0 may include a fixed voltage, which does not change according to temperature change. The bandgap reference circuit 600 may apply a reference voltage VREF0 to the third input terminal IN3 of the voltage control circuit 110. The bandgap reference circuit 600 may be included in the clock signal generator 10 or the clock signal generator 20.

The voltage control circuit 110 may apply, to the voltage output circuit 130, an output voltage VOUT generated based on the voltage negative temperature coefficient VNTC, the voltage zero temperature coefficient VZTC, the reference voltage VREF0, the feedback voltage VFB, and/or the temperature coefficient TC. The voltage output circuit 130 may output the power voltage VCAP of the clock signal generating circuit 300.

Although some example embodiments, in which the bandgap reference circuit 600 provides a reference voltage VREF0 to the voltage control circuit 110, are described with reference to FIG. 3B, the voltage control circuit 110 may receive the reference voltage VREF0 from various external power sources and is not limited to the example embodiments described above.

Figure 3C:
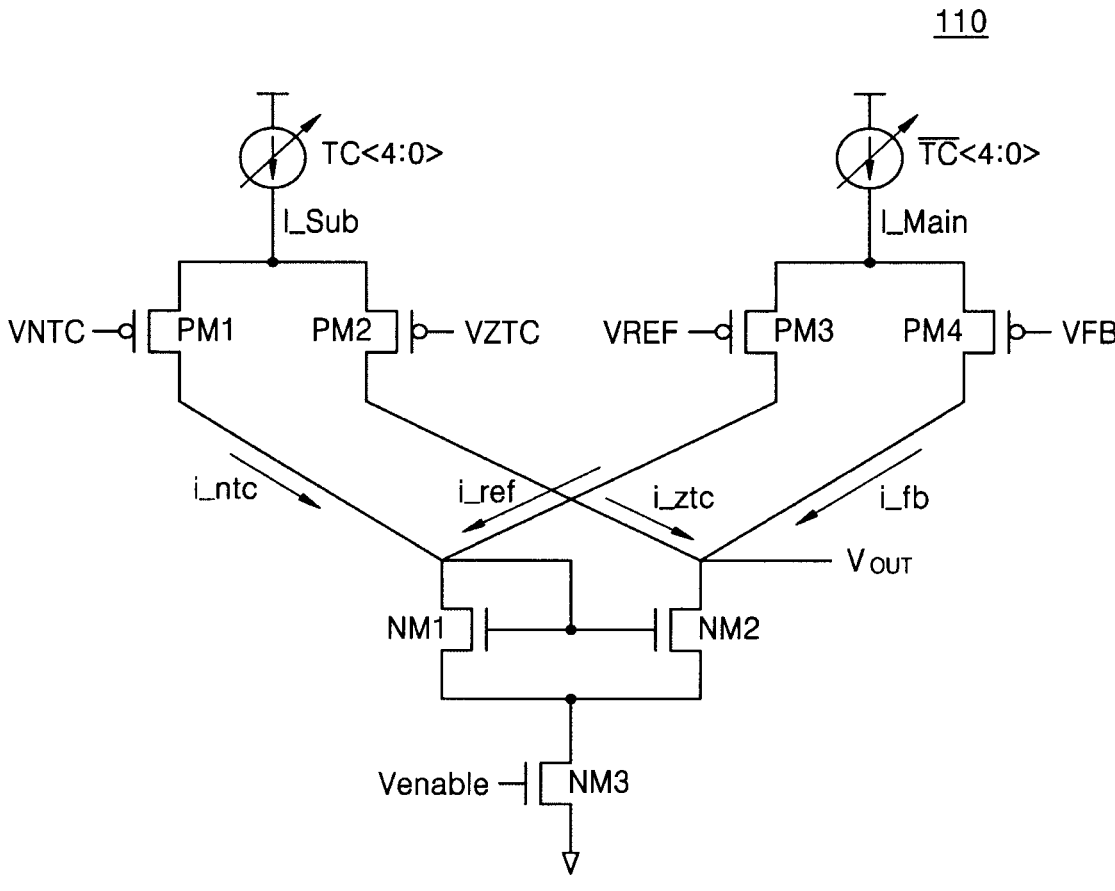
FIG. 3C illustrates a power supply adjustment circuit according to some example embodiments.

FIG. 3C illustrates the voltage control circuit 110 according to some example embodiments.

Referring to FIG. 3C, the voltage control circuit 110 may control the output voltage VOUT based on the voltage negative temperature coefficient VNTC, the voltage zero temperature coefficient VZTC, the feedback voltage VFB, and/or the temperature coefficient TC. For example, the voltage control circuit 110 may control the output voltage VOUT by controlling the current amount based on the temperature coefficient TC. Detailed descriptions thereof are given below.

The voltage control circuit 110 may include a first PMOS transistor PM1, a second PMOS transistor PM2, a third PMOS transistor PM3, a fourth PMOS transistor PM4, and/or first through third NMOS transistors NM1 through NM3. The voltage control circuit 110 may receive a current based on the temperature coefficient TC code. For example, the temperature coefficient TC code may have 5 bits. The voltage control circuit 110 may receive a current I_Sub from a current source based on the temperature coefficient TC code. The voltage control circuit 110 may receive a current I_Main based on a $\overline{TC}$ code, which is a complement of the temperature coefficient TC code. For example, when the temperature coefficient TC code includes 10010, the voltage control circuit 110 may receive the current I_Main based on the $\overline{TC}$ code 01101.

The voltage negative temperature coefficient VNTC may be applied to a gate of the PMOS transistor PM1. The voltage zero temperature coefficient VZTC may be applied to a gate of the PMOS transistor PM2. The reference voltage VREF may be applied to a gate of the PMOS transistor PM3. For example, the reference voltage VREF1 in FIG. 3A or the reference voltage VREF0 in FIG. 3B may be applied to the second PMOS transistor PM3.

A current I1 may be a sum of a current i_fb and a current i_ztc. A current I2 may be a sum of a current i_ref and a current i_ntc. When the voltage negative temperature coefficient VNTC is the same as the voltage zero temperature coefficient VZTC, the current I1 may be the same as the current I2. When the voltage negative temperature coefficient VNTC is different from the voltage zero temperature coefficient VZTC, a difference between the current I1 and the current I2 may occur. The voltage control circuit 110 may determine an offset voltage based on the difference between the current I1 and the current I2. When the voltage zero temperature coefficient VZTC is different from the voltage negative temperature coefficient VNTC, the voltage control circuit 110 may output a voltage level, in which an output voltage level and an offset voltage level of the case, where the voltage zero temperature coefficient VZTC is the same as the voltage negative temperature coefficient VNTC, are added.

Figure 3D:
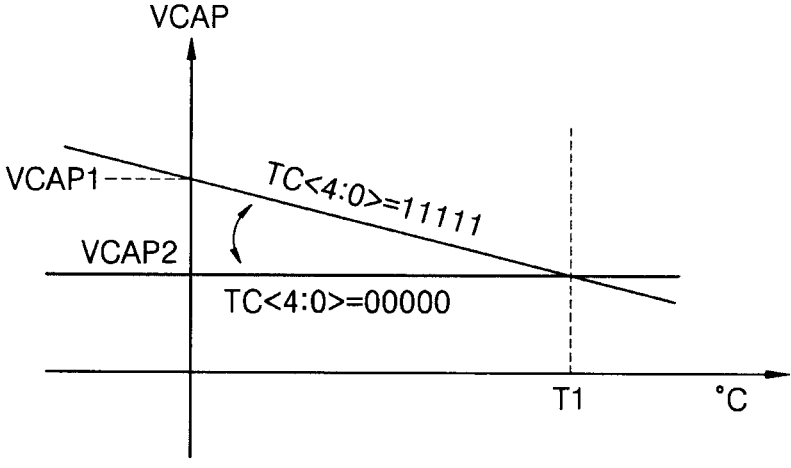
FIG. 3D illustrates a power voltage according to temperature change, according to some example embodiments.

FIG. 3D illustrates the power voltage VCAP according to temperature change, according to some example embodiments.

Referring to FIG. 3D, the change amount of the power voltage VCAP according to the temperature change amount may change according to the temperature coefficient TC code. In other words, slope values of lines in the graph of FIG. 3D may change according to the temperature coefficient TC code. For example, when the temperature coefficient TC code is about 0, a slope value of a level change of the power voltage VCAP according to the temperature change may be about 0. As another example, when the temperature coefficient TC code is 11111, the slope value of the level change of the power voltage VCAP according to the temperature change may be (VCAP1−VCAP2)/T1.

Figure 3E:
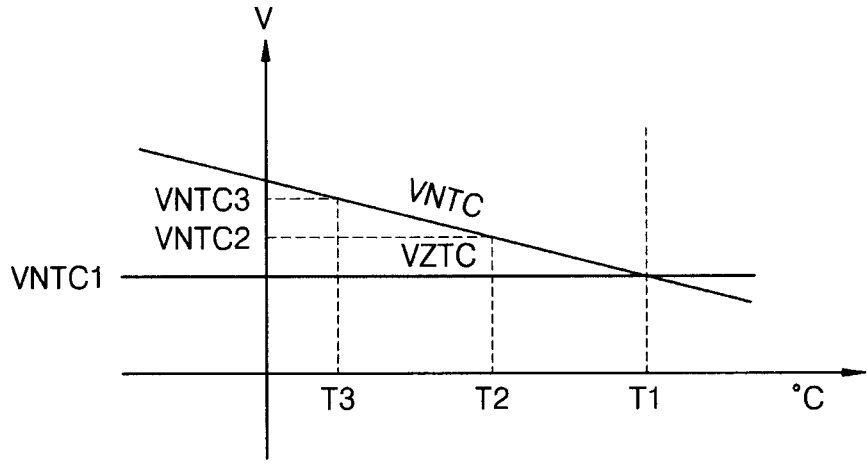
FIG. 3E illustrates temperature changes of a voltage negative temperature coefficient VNTC and a voltage zero temperature coefficient VZTC.

FIG. 3E illustrates temperature changes of the voltage negative temperature coefficient VNTC and the voltage zero temperature coefficient VZTC.

Referring to FIG. 3E, the X-axis may represent temperature and the Y-axis may represent the voltage level. The voltage negative temperature coefficient VNTC may mean a voltage, which changes according to change of temperature. The voltage zero temperature coefficient VZTC may mean a voltage, which does not change according to change of temperature. The voltage negative temperature coefficient VNTC and the voltage zero temperature coefficient VZTC may be generated from the same voltage generator (not illustrated). The voltage negative temperature coefficient VNTC and the voltage zero temperature coefficient VZTC may also be generated from different voltage generators (not illustrated). In the inventive concepts, the voltage negative temperature coefficient VNTC may be referred to as a temperature-varying voltage and the voltage zero temperature coefficient VZTC may be referred to as a temperature-fixed voltage.

Referring to FIG. 3E, the level of the voltage negative temperature coefficient VNTC may linearly decrease as the temperature increases, and the level of the voltage zero temperature coefficient VZTC may be constant even as the temperature increases or decreases.

A first temperature T1 may be higher than a second temperature T2, and the second temperature T2 may be higher than a third temperature T3. The voltage negative temperature coefficient VNTC at the first temperature T1 may be referred to as VNTC1, the voltage negative temperature coefficient VNTC at the second temperature T2 may be referred to as VNTC2, and the voltage negative temperature coefficient VNTC at the third temperature T3 may be referred to as VNTC3. The voltage negative temperature coefficient VNTC at the first temperature T1 may be the same as the voltage zero temperature coefficient VZTC. As the temperature increases, that is, T3<T2<T1, the voltage level of the voltage negative temperature coefficient VNTC may decrease, that is, VNTC3>VNTC2>VNTC1. However, although the temperature increases, the voltage level of the voltage zero temperature coefficient VZTC may also be constant.

Figure 3F:
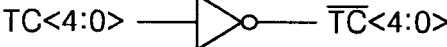
FIG. 3F illustrates a relationship between a temperature coefficient TC code and a code complementary with the temperature coefficient TC code.

FIG. 3F illustrates a relationship between the temperature coefficient TC code and a complement code of the temperature coefficient TC code. FIG. 3F may be described with reference to FIG. 3C.

Referring to FIG. 3F, an inverter may receive the temperature coefficient TC code and output the $\overline{TC}$ code. In other words, the temperature coefficient TC code may be a complement of the $\overline{TC}$ code.

Figure 4:
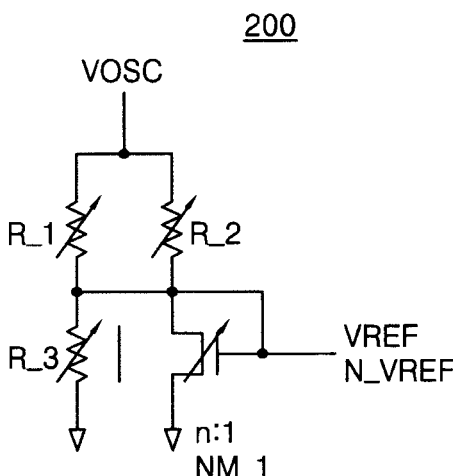
FIG. 4 illustrates a reference power controller according to some example embodiments.

FIG. 4 illustrates the reference voltage controller 200 according to some example embodiments. FIG. 4 is described with reference to FIGS. 1 and 2.

Referring to FIG. 4, the reference voltage controller 200 may include resistors R_1, R_2, and/or R_3 and/or n NMOS transistors NM_1. n may be an integer equal to or greater than 1. A gate of each, or one or more, of the n NMOS transistors NM_1 may be connected to the reference voltage node N_VREF. The reference voltage controller 200 may receive the internal power voltage VOSC from an internal power source of the clock signal generator 10. The internal power voltage VOSC may be referred to as the internal power voltage IVC. The internal power voltage VOSC may have linearity according to temperature change, but the linearity according to temperature change may be easily broken in a wide temperature range. The internal power voltage VOSC may be applied to a node between the resistor R_1 and the resistor R_2. The resistor R_1 and the resistor R_3 may be connected to each other in series, and the resistor R_3 may be connected between a reference voltage node N_VREF and a ground node. The reference voltage controller 200 may output the reference voltage VREF from the reference voltage node N_VREF.

The reference voltage controller 200 of the inventive concepts may provide the reference voltage VREF, which is hardly affected by temperature. In addition, when the reference voltage VREF provided by the reference voltage controller 200 is affected by temperature, the reference voltage VREF may change linearly according to temperature changes.

Figure 5:
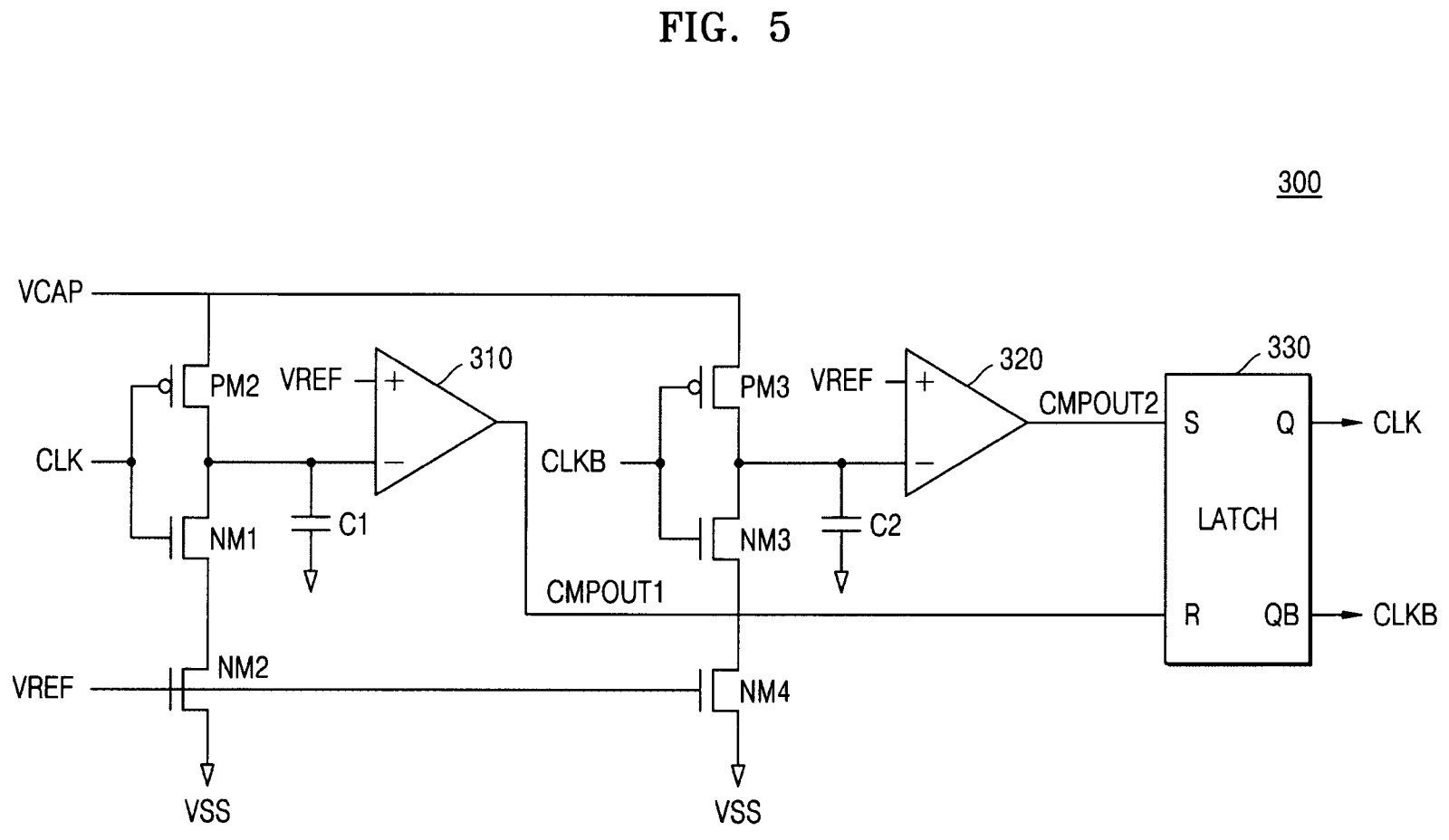

FIG. 5 illustrates the clock signal generating circuit 300 according to some example embodiments.

Referring to FIG. 5, the clock signal generating circuit 300 may include a first PMOS transistor PM2, the second PMOS transistor PM3, the first capacitor C1, the second capacitor C2, the first NMOS transistor NM1, the second NMOS transistor NM2, the third NMOS transistor NM3, the fourth NMOS transistor NM4, a first comparator 310, a second comparator 320, and a latch circuit 330. The first comparator 310 and the second comparator 320 may be referred to as an operational amplifier (OP-AMP) or a differential difference amplifier.

A first clock signal CLK may be at a logic high level. When the first clock signal CLK is at a logic high level, the first NMOS transistor NM1 may be turned on. When the first NMOS transistor NM1 is turned on, a current may be transferred from the first capacitor C1 to a ground voltage VSS. When a current is transferred from the first capacitor C1 to the ground voltage VSS, the voltage of the first capacitor C1 may decrease. When the voltage of the first capacitor C1 is less than a reference voltage VREF2, an output CMPOUT1 of the first comparator 310 may be at a logic low level. Accordingly, a second clock signal CLKB may be at a logic low level. When the second clock signal CLKB is at a logic low level, the second PMOS transistor PM3 may be turned on. When the second PMOS transistor PM3 is turned on, the power voltage VCAP may be provided to the second PMOS transistor PM3. When the power voltage VCAP is provided to the second capacitor C2, the voltage of the second capacitor C2 may be higher than the reference voltage VREF2. When the voltage of the second capacitor C2 is higher than the reference voltage VREF2, an output CMPOUT2 of the second comparator 320 may be at a logic high level. The latch circuit 330 may provide the first clock signal CLK and the second clock signal CLKB based on an output of the first comparator 310 and an output of the second comparator 320.

The clock signal generating circuit 300 according to the inventive concepts may generate a clock signal of a cycle, which linearly changes according to temperature changes, by operating based on the power voltage VCAP, which linearly changes according to the temperature changes.

In addition, the clock signal generating circuit 300 according to the inventive concepts may generate a clock signal of a cycle, which linearly changes according to temperature changes, by operating based on the reference voltage VREF, which is not affected by the temperature changes.

Figure 6:
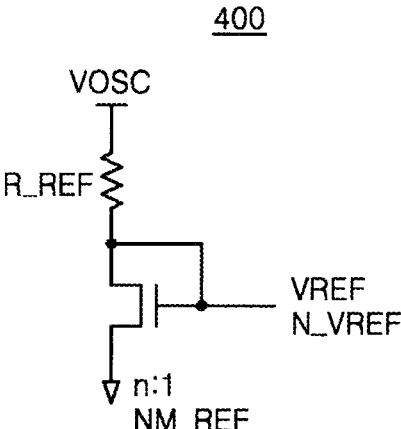
FIG. 6 illustrates a reference voltage provider according to some example embodiments.

FIG. 6 illustrates a reference voltage provider 400 according to some example embodiments.

Referring to FIG. 6, the reference voltage provider 400 may include a resistor R_REF and n NMOS transistors NM_REF. n may be an integer equal to or greater than 1. A gate of each, or one or more, of the n NMOS transistors NM_REF may be connected to the reference voltage node N_VREF. The reference voltage provider 400 may receive the internal power voltage VOSC from an internal power source of the clock signal generator 20. The reference voltage provider 400 may output the reference voltage VREF from the reference voltage node N_VREF.

Figure 7:
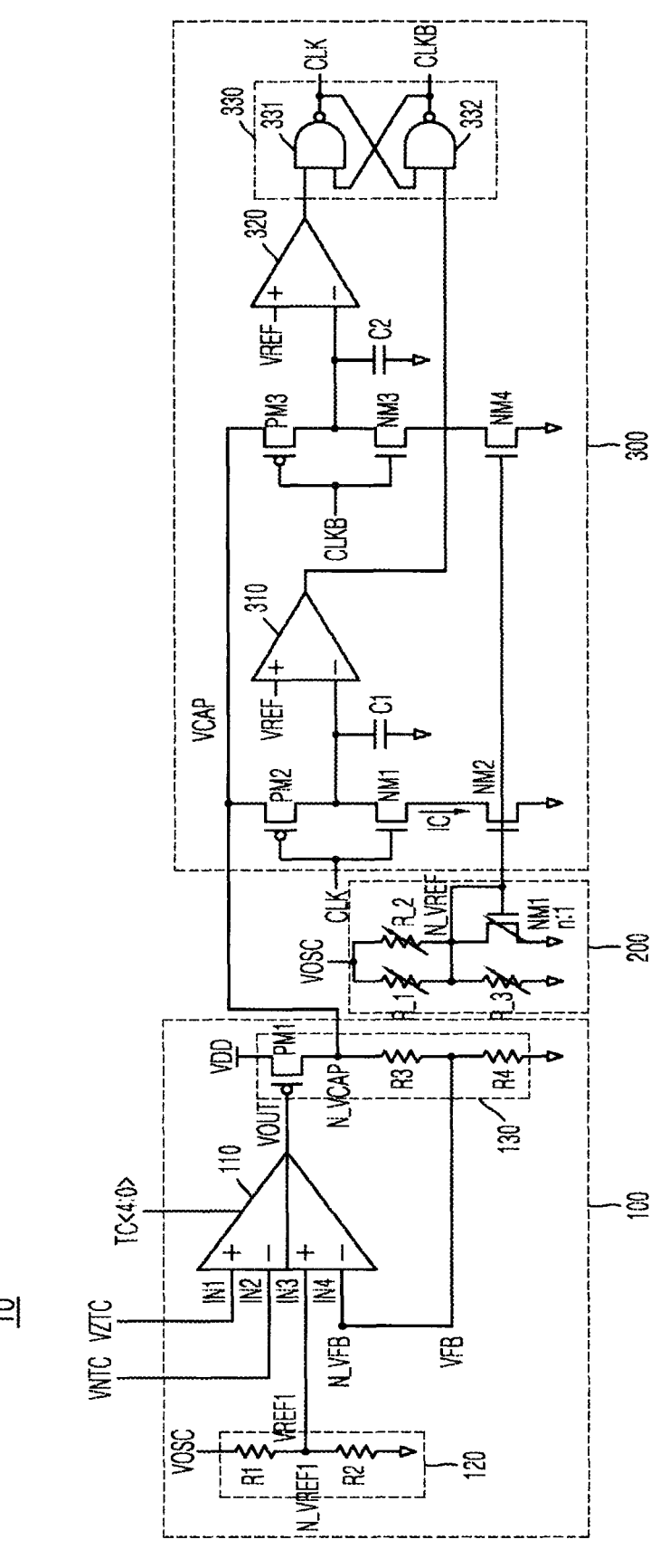
FIG. 7 illustrates a clock signal generator according to some example embodiments.

FIG. 7 illustrates the clock signal generator 10 according to some example embodiments. FIG. 7 may be described with reference to FIGS. 1, 3A, 3B, 3C, 4, and 5, and duplicate descriptions thereof may be omitted.

Referring to FIG. 7, the clock signal generator 10 may include the power voltage providing circuit 100, the reference voltage controller 200, and/or the clock signal generating circuit 300. The power voltage providing circuit 100 may include the reference voltage providing circuit 120, the voltage control circuit 110, and/or the voltage output circuit 130. The reference voltage controller 200 may receive the internal power voltage VOSC from an internal power source of the clock signal generator 10. The internal power voltage VOSC may be applied to a node between the resistor R1 and the resistor R2. The resistor R_1 and the resistor R_3 may be connected to each other in series, and the resistor R_3 may be connected between the reference voltage node N_VREF and the ground node. The reference voltage controller 200 may output the reference voltage VREF from the reference voltage node N_VREF. The clock signal generating circuit 300 may generate a clock signal of the cycle Tclk based on the power voltage VCAP and/or the reference voltage VREF. The cycle Tclk may be represented by Formula 2 below.

$$Tclk = nRC\left(\frac{VCAP - VREF}{VOSC - VREF}\right)$$ [Formula 2]

10

In Formula 2, Tclk may be referred to as a cycle of a clock signal CLK generated by the clock signal generating circuit 300. n may be referred to as the number of NMOS transistors of the reference voltage controller 200. R may mean $$\frac{R\_1 * R\_2}{R\_1 + R\_2}\,\Omega.$$

C may be referred to as capacitance of the first capacitor C1 and second capacitor C2 included in the clock signal generating circuit 300. VCAP may be referred to as a power voltage provided by the power voltage providing circuit 100 to the clock signal generating circuit 300. VREF may be referred to as a reference voltage provided by the reference voltage controller 200. VOSC may be referred to as the internal power voltage IVC applied to the reference voltage controller 200. In addition, VOSC may include a fixed voltage. Tclk may further include a latency due to the latch circuit 330.

Referring to Formula 2, the power voltage VCAP may be included in the numerator of the term on the right side thereof. Accordingly, the cycle Tclk may be proportional to the power voltage VCAP. The power voltage providing circuit 100 may adjust the power voltage VCAP according to temperature change based on the temperature coefficient TC. Accordingly, the cycle Tclk may linearly change according to temperature change.

In addition, the reference voltage VREF provided by the reference voltage controller 200 may not be dependent on temperature change. The reference voltage controller 200 may control the resistance values of the resistors R_1, R_2, and/or R_3 and/or the number of NMOS transistors NM_1. The reference voltage controller 200 may adjust the reference voltage VREF not to be significantly affected by temperature by using the resistors R_1, R_2, and/or R_3 and/or n NMOS transistors NM_1. On the other hand, a current IC may include a constant current regardless of the temperature coefficient TC.

Figure 8:
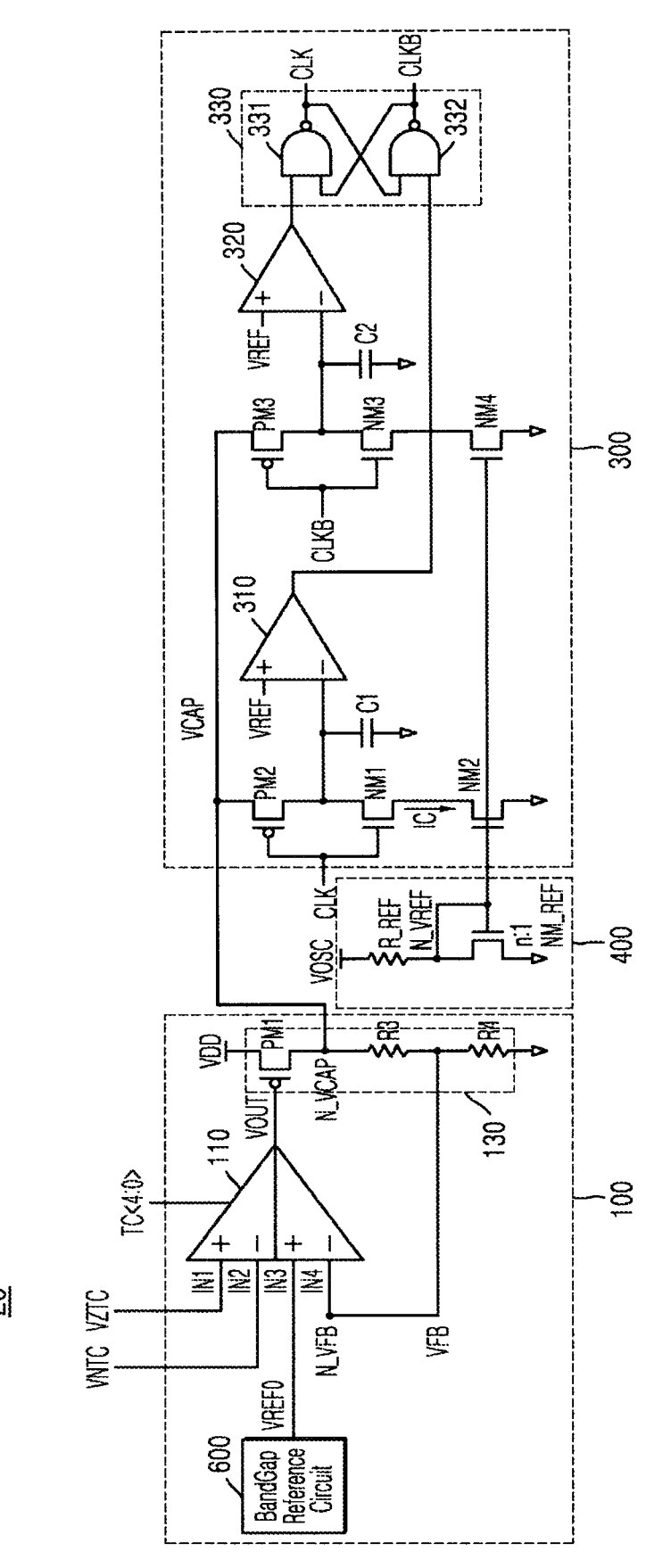
FIG. 8 illustrates a clock signal generator according to some example embodiments.

FIG. 8 illustrates the clock signal generator 20 according to some example embodiments. FIG. 8 may be described with reference to FIGS. 2, 3A, 3B, 3C, 5, and 6, and duplicate descriptions thereof may be omitted.

Referring to FIG. 8, the clock signal generator 20 may include the power voltage providing circuit 100, the reference voltage provider 400, and/or the clock signal generating circuit 300. The power voltage providing circuit 100 may include the voltage control circuit 110, the voltage output circuit 130, and/or the bandgap reference circuit 600. The reference voltage provider 400 may receive the internal power voltage VOSC from an internal power source of the clock signal generator 10. The internal power voltage VOSC may be applied to the resistor R_REF. The reference voltage provider 400 may provide the reference voltage VREF to the clock signal generating circuit 300.

The clock signal generating circuit 300 may generate a clock signal of the cycle Tclk based on the power voltage VCAP and the reference voltage VREF. The cycle Tclk may be represented by Formula 3 below.

$$Tclk = nRC\left(\frac{VCAP - VREF}{VOSC - VREF}\right)$$ [Formula 3]

In Formula 3, Tclk may be referred to as a cycle of a clock signal CLK generated by the clock signal generating circuit 300. n may be referred to as the number of NMOS transistors of the reference voltage provider 400. R may mean a resistance value of the resistor R_REF. C may be referred to as capacitance value of the first capacitor C1 and second capacitor C2 included in the clock signal generating circuit 300. VCAP may be referred to as a power voltage provided by the power voltage providing circuit 100 to the clock signal generating circuit 300. VREF may be referred to as a reference voltage provided by the reference voltage provider 400. VOSC may be referred to as the internal power voltage IVC applied to the reference voltage provider 400. In addition, VOSC may include a fixed voltage. Tclk may further include a latency due to the latch circuit 330.

Referring to Formula 3, the power voltage VCAP may be included in the numerator in the term on the right side thereof. Accordingly, the cycle Tclk may be proportional to the power voltage VCAP. The power voltage providing circuit 100 may adjust the power voltage VCAP according to temperature change based on the temperature coefficient TC. Accordingly, the cycle Tclk may linearly change according to temperature change. On the other hand, a current IC may include a constant current regardless of the temperature coefficient TC.

Figure 9:
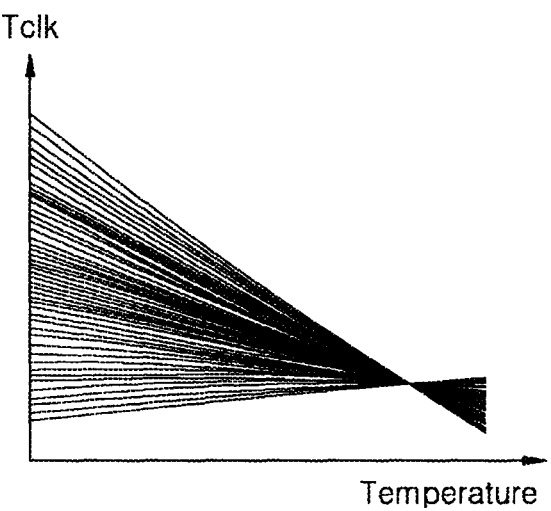
FIG. 9 illustrates a cycle according to a temperature of a clock signal generated by a clock signal generator, according to some example embodiments.

FIG. 9 illustrates a cycle according to a temperature of a clock signal generated by the clock signal generator 10, according to some example embodiments. FIG. 9 is described with reference to FIGS. 1 and 2.

Referring to FIG. 9, the cycle Tclk of a clock signal generated by the clock signal generator 10 and/or the clock signal generator 20 according to the inventive concepts may linearly change according to temperature changes.

Figure 10:
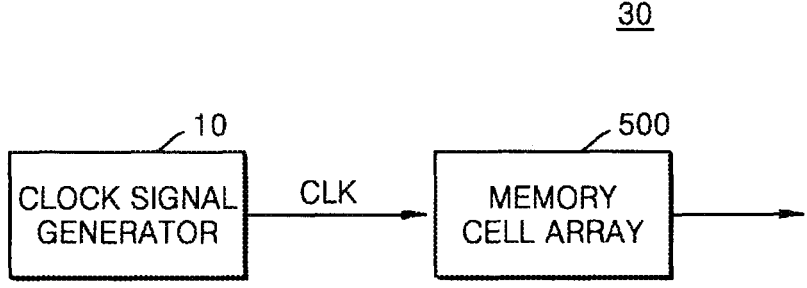
FIG. 10 illustrates a memory device according to some example embodiments.

FIG. 10 illustrates a memory device 30 according to some example embodiments.

Referring to FIG. 10, the memory device 30 may include the clock signal generator 10 and/or a memory cell array 500. The memory cell array 500 may be driven based on the clock signal CLK.

For example, the clock signal generator 10 may include a voltage control circuit 110, which provides the voltage negative temperature coefficient VNTC, the voltage zero temperature coefficient VZTC, a second reference voltage provided by the bandgap reference circuit 600, and/or the power voltage VACP, which change according to temperature based on the feedback voltage VFB and/or the temperature coefficient TC. The clock signal generator 10 may include a first reference voltage providing circuit, which provides a first reference voltage based on the internal power voltage corresponding to a constant voltage. The clock signal generator 10 may include a clock signal generating circuit, which generates a clock signal having a cycle proportional to the level of a power voltage based on the power voltage and a first reference voltage.

The memory device 30 may perform program, read, and/or erase operations on the memory cell array 500 based on the clock signal.

The clock signal generator 10 according to the inventive concepts may generate a clock signal of a cycle, which linearly changes according to temperature changes, by operating based on the reference voltage VREF, which is not affected by the temperature changes. Accordingly, memory device 30 may perform program, read, and/or erase operations on the memory cell array 500 more accurately based on the clock signal in an environment in which temperature change is large.

Figure 11:
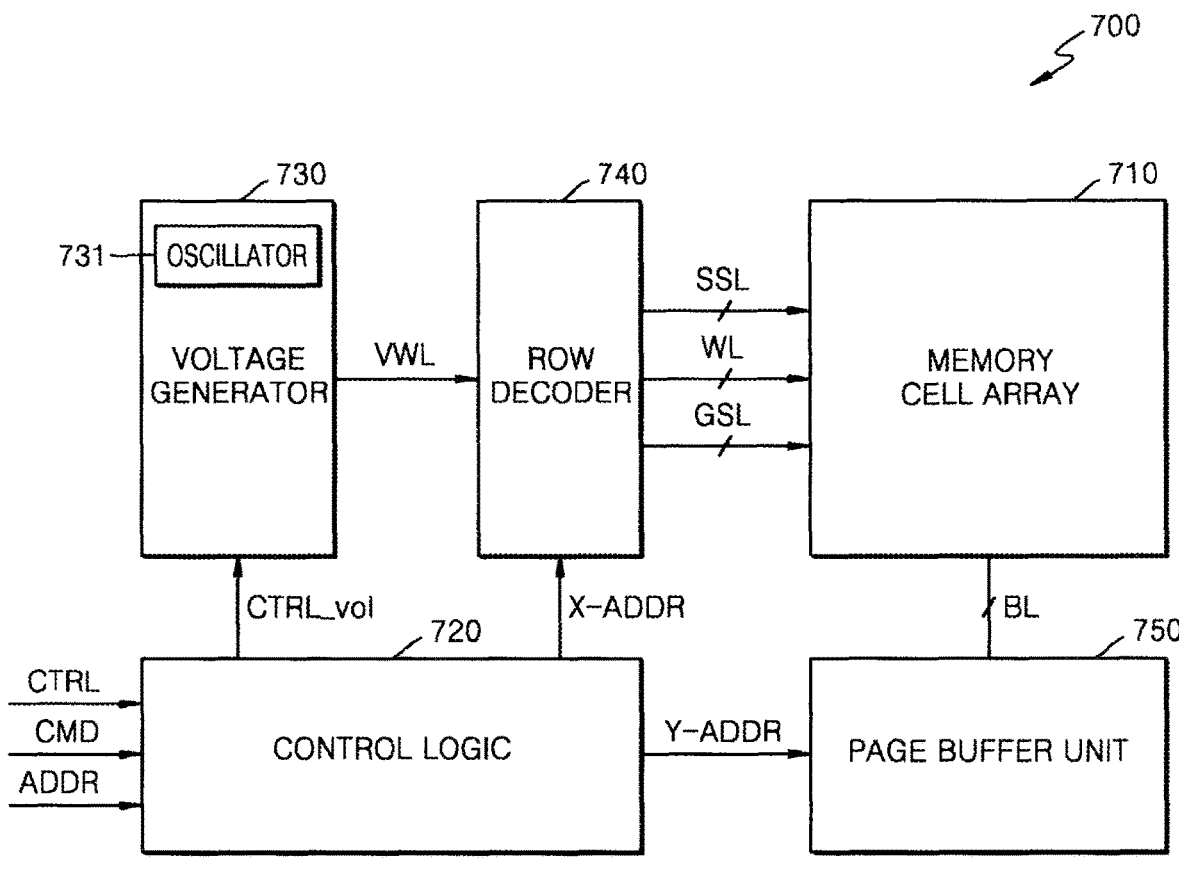
FIG. 11 illustrates a block diagram of a non-volatile memory device according to some example embodiments.

FIG. 11 illustrates a block diagram of a non-volatile memory device 700 according to some example embodiments.

Referring to FIG. 11, the non-volatile memory device 700 may include a memory cell array 710, a control logic 720, a voltage generator 730, a row decoder 740, and/or a page buffer unit 750. Although not illustrated in FIG. 11, the memory device 700 may further include a data input/output circuit, an input/output interface, etc. In addition, the non-volatile memory device 700 may further include a column logic, a pre-decoder, a temperature sensor, a command decoder, an address decoder, etc.

The voltage generator 730 may include an oscillator 731, and the oscillator 731 may correspond to the clock signal generator 10 of FIG. 1 or the clock signal generator 20 of FIG. 2. In addition, the oscillator 731 may be implemented to be included in the non-volatile memory device 700 and is not limited to the example embodiments of FIG. 11. The voltage generator 730 may generate a word line voltage VWL based on a clock signal generated by the oscillator 731.

The memory cell array 710 may be connected to the page buffer unit 750 via bit lines BL, and may be connected to the row decoder 740 via word lines WL, string selection lines SSL, and/or ground selection lines GSL. The memory cell array 710 may include a plurality of memory cells, and the plurality of memory cells may include, for example, flash memory cells. Hereinafter, some example embodiments of the inventive concepts are described in detail for the case, as an example, in which the plurality of memory cells include NAND flash memory cells. However, the inventive concepts are not limited thereto. In some example embodiments, the plurality of memory cells may include resistive memory cells, such as resistive RAM (RRAM) memory cells, phase-change RAM (PRAM) memory cells, and/or magneto-resistive RAM (MRAM) memory cells.

In some example embodiments, the memory cell array 710 may include a three-dimensional (3D) memory cell array, the 3D memory cell array may include a plurality of NAND strings, and each NAND string may include memory cells respectively connected to the word lines WL vertically stacked on a substrate, which is described in detail with reference to FIGS. 12 and 14. However, the inventive concepts are not limited thereto, and in some example embodiments, the memory cell array 710 may include a two-dimensional (2D) memory cell array, and the 2D memory cell array may include the plurality of NAND strings arranged in row and column directions.

Figure 12:
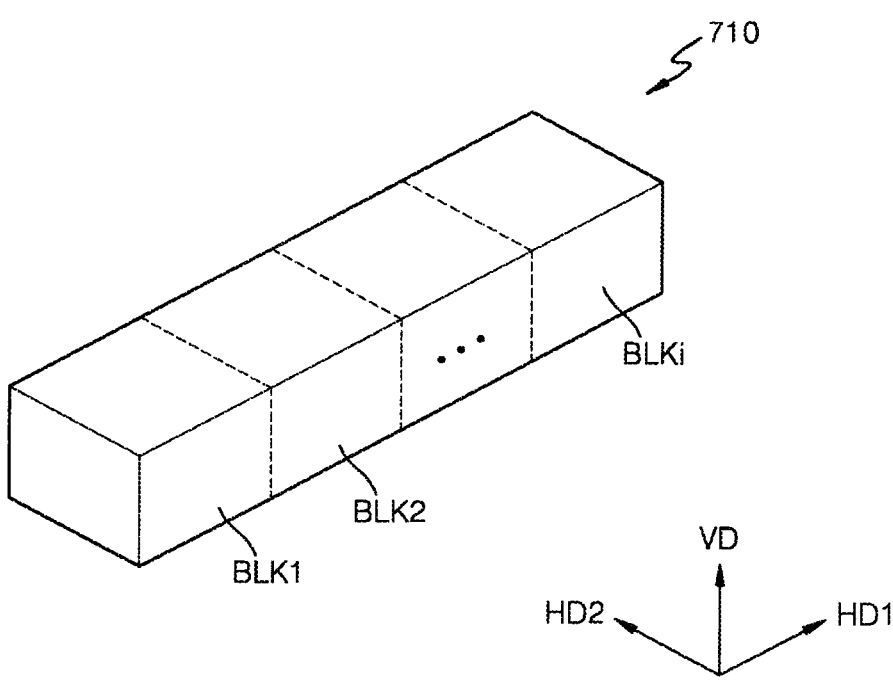
FIG. 12 illustrates a memory cell array according to some example embodiments.

FIG. 12 illustrates the memory cell array 710 according to some example embodiments. FIG. 12 may be described with reference to FIG. 11.

Referring to FIG. 12, the memory cell array 710 may include first through $i^{th}$ memory blocks BLK1 through BLKi, wherein the i may be a positive integer. Each, or one or more, of the first through $i^{th}$ memory blocks BLK1 through BLKi may have a 3D structure (or a vertical structure). Each, or one or more, of the first through $i^{th}$ memory blocks BLK1 through BLKi may include a plurality of NAND strings extending in a vertical direction VD. In this case, the plurality of NAND strings may be provided apart from each other by a certain distance in first and second horizontal directions HD1 and HD2. The first through $i^{th}$ memory blocks BLK1 through BLKi may be selected by the row decoder 740. For example, the row decoder 740 may select a memory block corresponding to a block address of the first through $i^{th}$ memory blocks BLK1 through BLKi.

Figure 13:
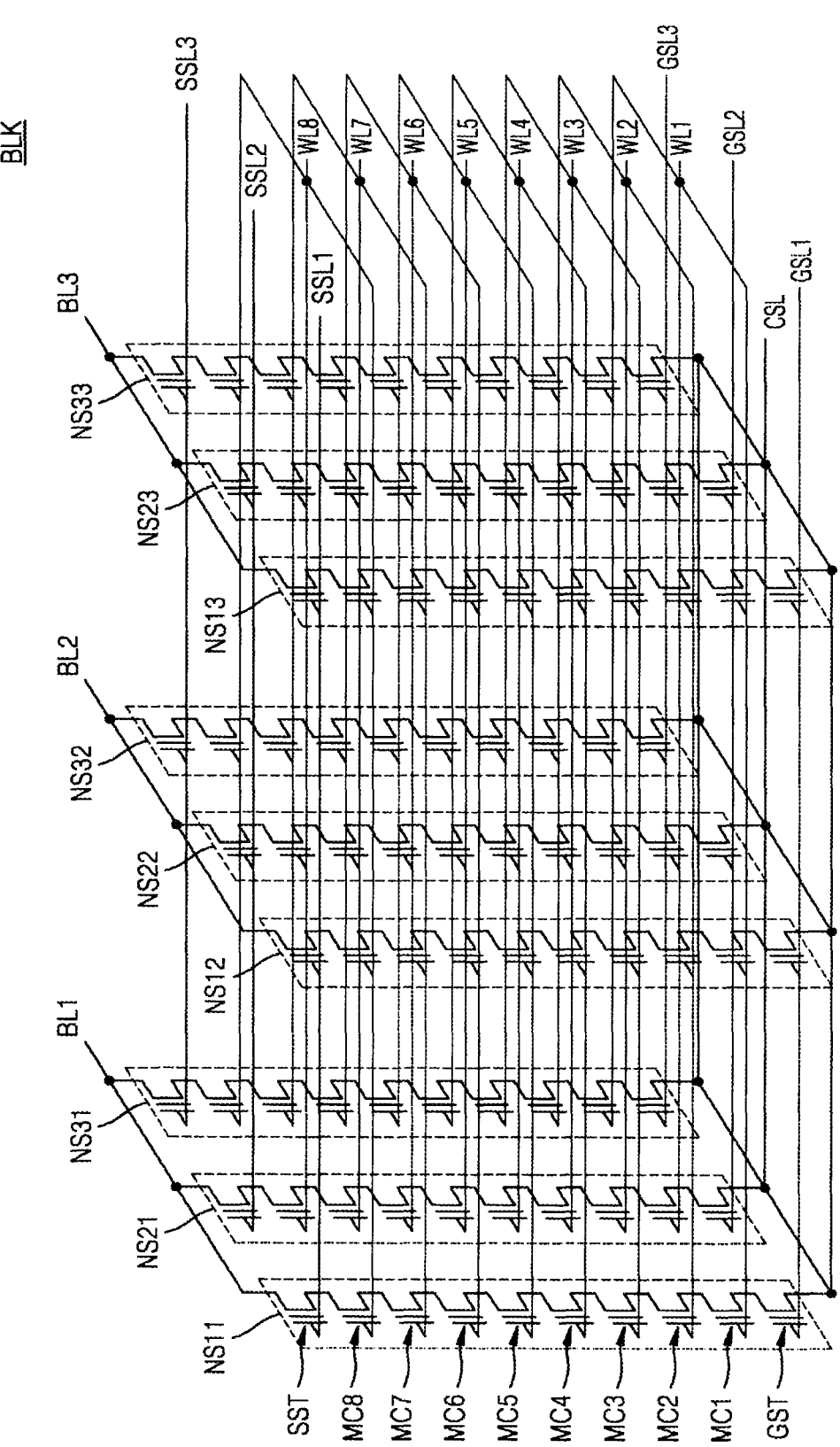
FIG. 13 illustrates a circuit diagram of an equivalent circuit of a memory block, according to some example embodiments.

FIG. 13 illustrates a circuit diagram of an equivalent circuit of a memory block BLK, according to some example embodiments. FIG. 13 is described with reference to FIGS.

11 and 12. For example, the memory block BLK may correspond to one of the first through i$^{th}$ memory blocks BLK1 through BLKi in FIG. 12.

Referring to FIG. 13, the memory block BLK may include a plurality of NAND cell strings, or NS11 through NS33, first through eighth word lines WL1 through WL8, first through third bit lines BL1 through BL3, first through third ground selection lines GSL1 through GSL3, first through third cell string selection lines SSL1 through SSL3, and/or a common source line CSL. In this case, the number of NAND strings, the number of word lines, the number of bit lines, the number of ground selection lines, and/or the number of string selection lines may be variously changed depending on some example embodiments.

The NAND strings, or NS11 through NS31, may be provided between the first bit line BL1 and the common source line CSL, the NAND strings, or NS12 through NS32, may be provided between the second bit line BL2 and the common source line CSL, and the NAND strings, or NS13 through NS33, may be provided between the third bit line BL3 and the common source line CSL. Each, or one or more, NAND cell string (for example, NS11) may include a string selection transistor SST, first through eighth memory cells MC1 through MC8, and/or a ground selection transistor GST, which are connected in series.

The string selection transistor SST may be connected to each, or one or more, of the first through third cell string selection lines SSL1 through SSL3 corresponding thereto. The first through eighth memory cells MC1 through MC8 may be connected to the first through eighth memory cells MC1 through MC8, respectively corresponding thereto. The ground selection transistor GST may be connected to each, or one or more, of the first through third ground selection lines GSL1 through GSL3 corresponding thereto. The string selection transistor SST may be connected to each, or one or more, of the first through third bit lines BL1 through BL3 corresponding thereto, and the ground selection transistor GST may be connected to the common source line CSL.

In some example embodiments, word lines of the same height (for example, the first word line WL1) may be commonly connected to each other, the first through third cell string selection lines SSL1 through SSL3 may be separated from each other, and the first through third ground selection lines GSL1 through GSL3 may also be separated from each other. Although in FIG. 13 three string selection lines, or SSL1 through SSL3 are illustrated sharing word lines of the same height, the inventive concepts are not limited thereto. For example, two string selection lines may share word lines of the same height. In another example, four string selection lines may share word lines of the same height.

Figure 14:
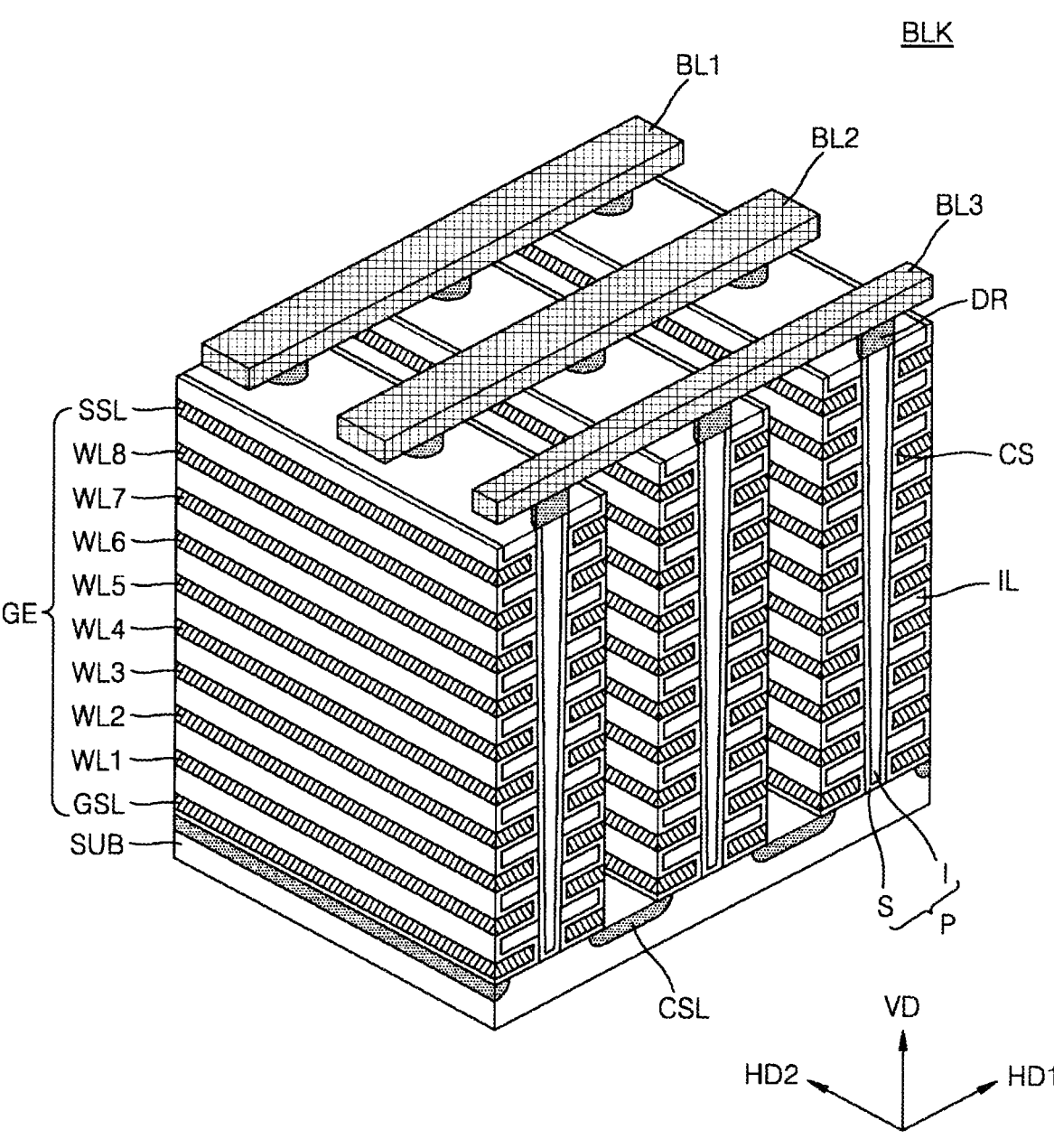
FIG. 14 is an example perspective view of a memory block in FIG. 13.

FIG. 14 is an example perspective view of the memory block BLK in FIG. 13.

Referring to FIG. 14, the memory block BLK may be formed in a direction perpendicular to a substrate SUB. The substrate SUB may be of a first conductivity type (for example, p-type), and a common source line CSL, which extends in a second horizontal direction HD2 on the substrate SUB and is doped with a second conductivity type (for example, n-type), may be provided. On a region between two adjacent common source lines CSL on the substrate SUB, a plurality of insulating layers IL, which extend in the second horizontal direction HD2, may be sequentially provided in the vertical direction VD, and a plurality of insulating layers IL may be apart from each other by a certain distance in the vertical direction VD. For example, the plurality of insulating layers IL may include an insulating material such as silicon oxide.

On a region between two adjacent common source lines CSL on the substrate SUB, a plurality of pillars P, which are sequentially arranged in the first horizontal direction HD1, and respectively penetrate the plurality of insulating layers IL in the vertical direction VD, may be provided. For example, the plurality of pillars P may penetrate the plurality of insulating layers IL and contact the substrate SUB. A surface layer S of each pillar P may include a silicon material of the first type, and may function as a channel region. On the other hand, an inner layer I of each pillar P may include an insulating material, such as silicon oxide and/or an air gap.

In a region between two adjacent common source lines CSL, a charge storage layer CS may be provided along exposed surfaces of the insulating layers IL, the pillars P, and the substrate SUB. The charge storage layer CS may include a gate insulating layer (or, referred to as a tunneling insulating layer), a charge trap layer, and/or a blocking insulating layer. For example, the charge storage layer CS may have an oxide-nitride-oxide (ONO) structure. In addition, in a region between two adjacent common source lines CSL, and/or on an exposed surface of the charge storage layer CS, a gate electrode GE including ground selection lines such as the first ground selection line GSL1, string selection lines such as the first string selection line SSL1, and/or the first through eighth word lines WL1 through WL8 may be provided.

Drains or drain contacts DR may be respectively provided on the plurality of pillars P. For example, the drains or drain contacts DR may include a silicon material doped with impurities of the second conductivity type. On the drains DR, the first through third bit lines BL1 through BL3 extending in a first horizontal direction HD1 and arranged apart from each other by a particular distance in the second horizontal direction HD2 may be provided.

As illustrated in FIGS. 12 through 14, when the memory cell array 710 includes a 3D memory cell array, the integration of the non-volatile memory device 700 may be improved by increasing the number of first through eighth word lines WL1 through WL8 stacked vertically on the substrate SUB. As the number of first through eighth word lines WL1 through WL8 stacked vertically on the substrate SUB increases, the gap between the first through eighth word lines WL1 through WL8 decreases, and as a result, the capacitance of the first through eighth word lines WL1 through WL8 in the form of plates may increase. Because a loading time of the first through eighth word lines WL1 through WL8 corresponds to the product of resistance and capacitance, the loading time thereof may increase as the capacitance increases.

An increase in the loading time of the first through eighth word lines WL1 through WL8 may increase the time of an operation, such as a program operation, a read operation, a program verification operation, and/or an erase verification operation on the non-volatile memory device 700. Accordingly, the performance of the non-volatile memory device 700 may decrease. Accordingly, to improve both the integration and performance of the non-volatile memory device 700, a method of reducing the loading time of the first through eighth word lines WL1 through WL8 may be required, or sufficient, while the number of first through eighth word lines WL1 through WL8 vertically stacked on the substrate SUB increases.

In addition, the control logic 720 may, based on a command CMD, an address ADDR, and/or a control signal CTRL, output various control signals, such as a voltage control signal CTRL_vol, a row address X-ADDR, and a column address Y-ADDR, for programming data in the memory cell array 710, reading data from the memory cell array 710, and/or erasing data stored in the memory cell array 710. In this manner, the control logic 720 may control all, or one or more, of various operations in the non-volatile memory device 700.

The voltage generator 730 may generate various kinds of voltages for performing program, read, and/or erase operations on the memory cell array 710 based on the voltage control signal CTRL_vol. The voltage generator 730 may generate a word line voltage VWL, for example, a program voltage, a read voltage, a pass voltage, an erase verify voltage, a program verify voltage, etc. In addition, the voltage generator 730 may further generate a string selection line voltage and/or a ground selection line voltage based on the voltage control signal CTRL_vol.

The row decoder 740 may, in response to the row address X-ADDR, select one of the memory blocks, may select one of the word lines, such as the first word lines WL1, of the selected memory block, and/or may select one of the string selection lines, such as the first string selection line SSL1. The page buffer unit 750 may select some of the bit lines, such as the first bit line BL1, in response to the column address Y-ADDR. The page buffer unit 750 may operate as a write driver or a sense amplifier according to an operation mode.

Figure 15:
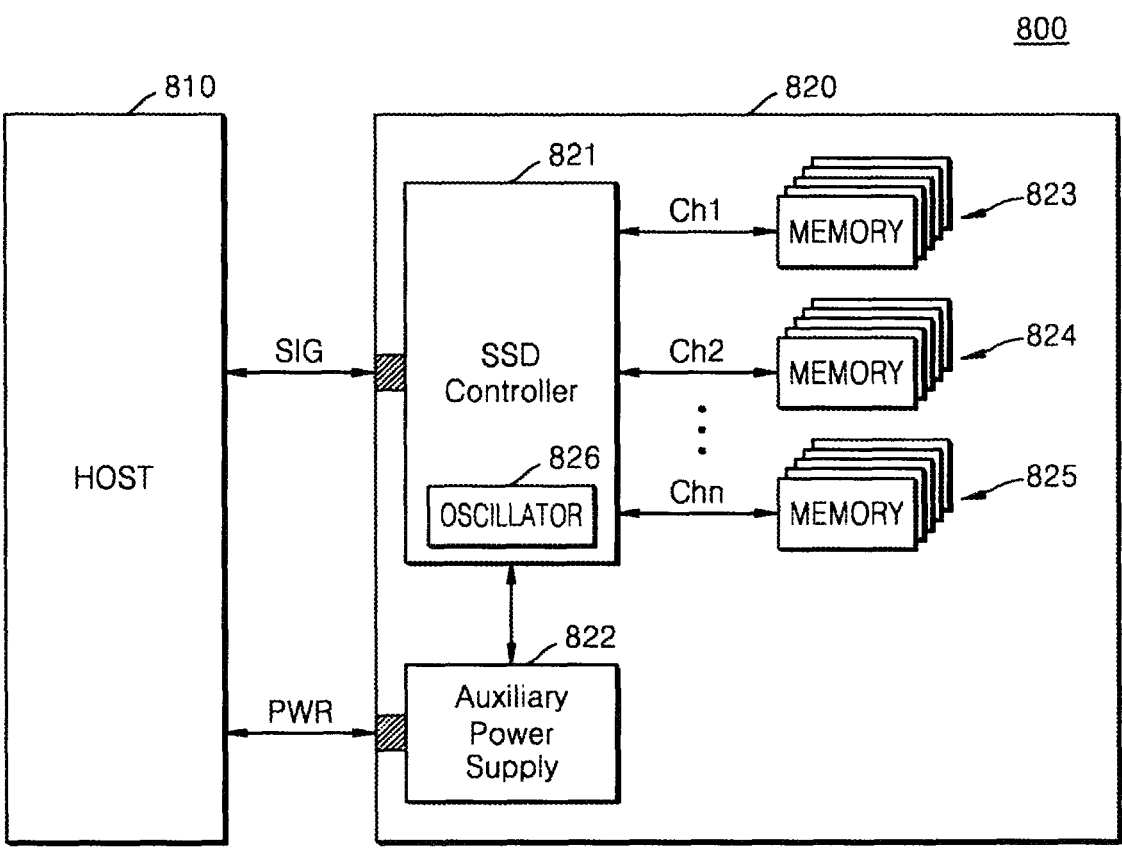
FIG. 15 is a block diagram of a solid state drive (SSD) according to some example embodiments.

FIG. 15 is a block diagram of a solid state drive (SSD) system 800 according to some example embodiments.

Referring to FIG. 15, the SSD system 800 may include a host 810 and/or an SSD 820. The SSD 820 may exchange signals with the host 810 via a signal connector, and receive a power supply via a power connector. The SSD 820 may include an SSD controller 821, an auxiliary power supply device 822, and/or memories 823, 824, and/or 825. The SSD controller 821 may include an oscillator 826. The oscillator 826 may correspond to the clock signal generator 10 of FIG. 1 or the clock signal generator 20 of FIG. 2. The oscillator 826 may be implemented to be included in the SSD system 800 but is not limited to the example embodiments of FIG. 15, in which the oscillator 826 is included in the SSD controller 821.

The memory devices 823, 824, and/or 825 may include NAND flash memory devices of a vertical stacking type. In this case, the SSD 820 may be implemented by using the example embodiments described above with reference to FIGS. 1 through 14. The memory devices 823, 824, and/or 825 may be implemented by using the example embodiments described above with reference to FIGS. 1 through 14.

When the words "about" and "substantially" are used in this application in connection with a numerical value, it is intended that the associated numerical value include a tolerance of ±10% around the stated numerical value, unless otherwise explicitly defined. Further, regardless of whether numerical values are modified as "about" or "substantially," it will be understood that these values should be construed as including a of +10% around the stated numerical value.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to some example embodiments thereof, it will be understood that various changes in form and details may be made therein without departing from the spirit and scope of the following claims.

What is claimed is:

1. A clock signal generator comprising:
   a power voltage providing circuit configured to provide a first power voltage, the first power voltage changing according to a temperature based on a temperature coefficient;
   a first reference voltage providing circuit configured to provide a first reference voltage based on an internal power voltage; and
   a clock signal generating circuit configured to generate a clock signal based on the first power voltage and the first reference voltage, the clock signal generating circuit including a first capacitor, a second capacitor, a latch circuit, and a resistor capacitor (RC) oscillator,
   wherein charges and discharges of each of the first capacitor and the second capacitor are based on the first power voltage, and
   wherein the RC oscillator is configured to generate the clock signal using the latch circuit and the charges and discharges of each of the first capacitor and the second capacitor.

2. The clock signal generator of claim 1, wherein the power voltage providing circuit is configured to provide the first power voltage having a linear relationship with the temperature.

3. The clock signal generator of claim 2, wherein the clock signal generating circuit is configured to generate the clock signal having a cycle linearly proportional to the first power voltage.

4. The clock signal generator of claim 1, wherein the power voltage providing circuit comprises:
   a second reference voltage providing circuit configured to provide a second reference voltage based on the internal power voltage or an external power voltage; and
   a voltage control circuit configured to control a voltage based on the second reference voltage, a voltage negative temperature coefficient (VNTC), a voltage zero temperature coefficient (VZTC), a feedback voltage (VFB), and the temperature coefficient.

5. The clock signal generator of claim 4, wherein the voltage control circuit comprises:
   a differential difference amplifier configured to provide an amplified output voltage based on the second reference voltage, the VNTC, the VZTC, the VFB, and the temperature coefficient; and
   a voltage output circuit including a first p-channel metal-oxide semiconductor (MOS) (PMOS) transistor, the voltage output circuit configured to
      apply the amplified output voltage to a gate terminal of the first PMOS transistor, and
      output the first power voltage at a drain terminal of the first PMOS transistor in response to receiving the amplified output voltage,
   wherein a first resistor is connected between a ground node and a feedback node, at which the voltage output circuit is configured to apply the VFB to the differential difference amplifier, and
   wherein a second resistor is connected between the feedback node and the drain terminal of the first PMOS transistor.

6. The clock signal generator of claim 4, wherein the second reference voltage providing circuit comprises a bandgap reference circuit.

7. The clock signal generator of claim 4, wherein the second reference voltage providing circuit is identical to the first reference voltage providing circuit.

8. The clock signal generator of claim 1, wherein the first reference voltage providing circuit comprises:

a third resistor and a fourth resistor connected in parallel between a first node and a second node, the first reference voltage providing circuit configured to apply the internal power voltage to the first node;

a fifth resistor connected between the second node and a ground node; and a first n-channel MOS (NMOS) transistor, wherein a source terminal of the first NMOS transistor is connected to the ground node, a gate terminal and a drain terminal of the first NMOS transistor are connected to the second node, and the first NMOS transistor comprises n NMOS transistors, where n is an integer greater than 1, and a voltage at the second node is the first reference voltage.

9. The clock signal generator of claim 8, wherein the clock signal generating circuit is configured to charge and discharge the first capacitor and the second capacitor based on the first power voltage, and generate the clock signal having a cycle Tclk according to an equation $$Tclk=nRC((VCAP-VREF)/(IVC-VREF)),$$

wherein, n represents a number of first NMOS transistors, R represents a synthesized resistance value of the third resistor and the fourth resistor, C represents capacitance of the first capacitor and the second capacitor, VCAP represents a voltage level of the first power voltage, VREF represents a voltage level of the first reference voltage, and IVC represents a voltage level of the internal power voltage.

10. The clock signal generator of claim 1, wherein the first reference voltage providing circuit comprises:

a first resistor connected between a first node and a second node, the first reference voltage providing circuit configured to apply the internal power voltage to the first node; and a first NMOS transistor, wherein a source terminal of the first NMOS transistor is connected to a ground node, a gate terminal and a drain terminal of the first NMOS transistor are connected to the second node, the first NMOS transistor comprises n NMOS transistors, where n is an integer greater than 1, and a voltage at the second node is the first reference voltage.

11. The clock signal generator of claim 1, wherein the clock signal generating circuit further comprises a first differential difference amplifier, a second differential difference amplifier, a second PMOS transistor, a third PMOS transistor, a second NMOS transistor, a third NMOS transistor, a fourth NMOS transistor, and a fifth NMOS transistor, wherein the clock signal generator is configured to generate the clock signal including a first clock signal and a second clock signal, input the first clock signal to a gate terminal of the second PMOS transistor and a gate terminal of the second NMOS transistor, a drain terminal of the second PMOS transistor being connected to a drain terminal of the second NMOS transistor, input the second clock signal to a gate terminal of the third PMOS transistor and a gate terminal of the third NMOS transistor, a drain terminal of the third PMOS transistor being connected to a drain terminal of the third NMOS transistor, input the first reference voltage at a first input node of the first differential difference amplifier, a first input node of the second differential difference amplifier, a gate terminal of the fourth NMOS transistor, and a gate terminal of the fifth NMOS transistor, and output a first output voltage of the first differential difference amplifier and a second output voltage of the second differential difference amplifier as inputs to the latch circuit, wherein the drain terminal of the fourth NMOS transistor is connected to a source terminal of the second NMOS transistor, and a source terminal of the fourth NMOS transistor is connected to a ground node, wherein the drain terminal of the fifth NMOS transistor is connected to a source terminal of the third NMOS transistor, and a source terminal of the fifth NMOS transistor is connected to the ground node, wherein the first capacitor is connected between a second input node of the first differential difference amplifier and the ground node, and the second input node of the first differential difference amplifier is connected to the drain terminal of the second NMOS transistor, wherein the second capacitor is connected between a second input node of the second differential difference amplifier and the ground node, and the second input node of the second differential difference amplifier is connected to the drain terminal of the third NMOS transistor, and wherein the latch circuit is configured to output the first clock signal and the second clock signal.

12. A clock signal generator comprising:

a voltage control circuit configured to provide a voltage negative temperature coefficient (VNTC), a voltage zero temperature coefficient (VZTC), a second reference voltage provided by a bandgap reference circuit, and a first power voltage changing according to a temperature based on a feedback voltage (VFB) and a temperature coefficient;

a first reference voltage providing circuit configured to provide a first reference voltage based on an internal power voltage corresponding to a constant voltage; and a clock signal generating circuit configured to generate a clock signal having a cycle Tclk proportional to a power voltage level based on the first power voltage and the first reference voltage, the clock signal generating circuit including a first capacitor, a second capacitor, a latch circuit, and a resistor capacitor (RC) oscillator, wherein charges and discharges of each of the first capacitor and the second capacitor are based on the first power voltage, and wherein the RC oscillator is configured to generate the clock signal using the latch circuit and the charges and discharges of each of the first capacitor and the second capacitor.

13. The clock signal generator of claim 12, wherein the voltage control circuit is configured to provide the first power voltage having a linear relationship with the temperature.

14. The clock signal generator of claim 13, wherein the clock signal generating circuit is configured to generate the cycle Tclk of the clock signal to be linearly proportional to the power voltage level.

15. The clock signal generator of claim 14, wherein the clock signal generating circuit is configured to charge and discharge the first capacitor and the second capacitor based on the first power voltage, and generate the cycle Tclk of the clock signal is according to an equation $$Tclk=nRC((VCAP-VREF)/(IVC-VREF)),$$

wherein, n represents a number of first NMOS transistors, R represents a synthesized resistance value of a third resistor and a fourth resistor, C represents capacitance of the first capacitor and the second capacitor, VCAP represents a voltage level of the first power voltage, VREF represents a voltage level of the first reference voltage, and IVC represents a voltage level of the internal power voltage.

16. The clock signal generator of claim 12, wherein the voltage control circuit comprises:

a differential difference amplifier configured to provide an amplified output voltage based on the second reference voltage, the VNTC, the VZTC, the VFB, and the temperature coefficient; and a voltage output circuit comprising:

a first p-channel metal-oxide semiconductor (MOS) (PMOS) transistor;

a first resistor; and a second resistor, the voltage output circuit configured to apply the amplified output voltage to a gate terminal of the first PMOS transistor, and output the first power voltage at a drain terminal of the first PMOS transistor in response to receiving the amplified output voltage, wherein the first resistor is connected between a ground node and a feedback node, at which the voltage output circuit is configured to apply the VFB to the differential difference amplifier, and wherein the second resistor is connected between the feedback node and the drain terminal of the first PMOS transistor.

17. The clock signal generator of claim 12, wherein the first reference voltage providing circuit comprises:

a third resistor and a fourth resistor connected in parallel between a first node and a second node, the first reference voltage providing circuit configured to apply the internal power voltage to the first node;

a fifth resistor connected between the second node and a ground node; and a first n-channel MOS (NMOS) transistor, wherein a source terminal of the first NMOS transistor is connected to the ground node, a gate terminal and a drain terminal of the first NMOS transistor are connected to the second node, and the first NMOS transistor comprises n NMOS transistors, where n is an integer greater than 1, and a voltage at the second node is the first reference voltage.

18. A memory device comprising:

a clock signal generator configured to generate a clock signal; and a memory cell array configured to be driven based on the clock signal, wherein the clock signal generator comprises:

a voltage control circuit configured to provide a voltage negative temperature coefficient (VNTC), a voltage zero temperature coefficient (VZTC), a second reference voltage provided by a bandgap reference circuit, and a first power voltage changing according to temperature based on a feedback voltage and a temperature coefficient;

a first reference voltage providing circuit configured to provide a first reference voltage based on an internal power voltage corresponding to a constant voltage; and a clock signal generating circuit configured to generate a clock signal having a cycle proportional to a power voltage level based on the first power voltage and the first reference voltage, the clock signal generating circuit including a first capacitor, a second capacitor, a latch circuit, and a resistor capacitor (RC) oscillator wherein charges and discharges of each of the first capacitor and the second capacitor are based on the first power voltage, wherein the RC oscillator is configured to generate the clock signal using the latch circuit, and the charges and discharges of each of the first capacitor and the second capacitor, and wherein at least one of a program operation, a read operation, or an erase operation on the memory cell array is performed based on the clock signal.

* * * * *